United States Patent
Hustad et al.

(10) Patent No.: US 10,011,713 B2
(45) Date of Patent: Jul. 3, 2018

(54) COPOLYMER FORMULATION FOR DIRECTED SELF ASSEMBLY, METHODS OF MANUFACTURE THEREOF AND ARTICLES COMPRISING THE SAME

(71) Applicants: Rohm and Haas Electronic Materials LLC, Marlborough, MA (US); Dow Global Technologies LLC, Midland, MI (US)

(72) Inventors: Phillip D. Hustad, Natick, MA (US); Peter Trefonas, III, Medway, MA (US); Shih-Wei Chang, Natick, MA (US)

(73) Assignees: DOW GLOBAL TECHNOLOGIES LLC, Midland, MI (US); ROHM AND HAAS ELECTRONIC MATERIALS LLC, Marlborough, MA (US)

( * ) Notice: Subject to any disclaimer, the term of this patent is extended or adjusted under 35 U.S.C. 154(b) by 0 days.

(21) Appl. No.: 14/944,470

(22) Filed: Nov. 18, 2015

(65) Prior Publication Data
US 2016/0186003 A1    Jun. 30, 2016

Related U.S. Application Data

(60) Provisional application No. 62/097,679, filed on Dec. 30, 2014.

(51) Int. Cl.
*C09D 153/00* (2006.01)
*C08L 53/00* (2006.01)

(52) U.S. Cl.
CPC ...... *C08L 53/00* (2013.01); *B81C 2201/0149* (2013.01)

(58) Field of Classification Search
None
See application file for complete search history.

(56) References Cited

U.S. PATENT DOCUMENTS 7,521,090 B1 *    4/2009    Cheng ............... B05D 5/00
                                                    427/256
8,059,350 B2    11/2011    Albrecht et al.
(Continued)

FOREIGN PATENT DOCUMENTS

JP    2005041931 A    2/2005
JP    2013079349 A    5/2013
(Continued)

OTHER PUBLICATIONS

Verduzco et al. "Structure, function, self-assembly, and applications of bottlebrush copolymers"; Chem. Soc. Rev; 44; 2015, pp. 2405-2420.
(Continued)

*Primary Examiner* — Arrie L Reuther
(74) *Attorney, Agent, or Firm* — Cantor Colburn LLP

(57) ABSTRACT

Disclosed herein is a composition comprising a block copolymer; where the block copolymer comprises a first polymer and a second polymer; where the first polymer and the second polymer of the block copolymer are different from each other and the block copolymer forms a phase separated structure; and an additive polymer; where the additive polymer comprises a reactive moiety that is reacted to a substrate upon which it is disposed; and where the additive polymer comprises a homopolymer that is the chemically and structurally the same as one of the polymers in the block copolymer or where the additive polymer comprises a random copolymer that has a preferential interaction with one of the blocks of the block copolymers.

4 Claims, 6 Drawing Sheets

(56) References Cited

U.S. PATENT DOCUMENTS

| | | | |
|---|---|---|---|
| 8,101,261 B2 | 1/2012 | Millward et al. | |
| 8,343,578 B2 | 1/2013 | Kim et al. | |
| 8,716,151 B2 | 5/2014 | Zhang et al. | |
| 8,821,738 B2 | 9/2014 | Hustad | |
| 8,822,615 B1 | 9/2014 | Trefonas | |
| 2005/0112886 A1 | 5/2005 | Asakawa et al. | |
| 2006/0134556 A1* | 6/2006 | Nealey | B81C 1/00031 430/311 |
| 2007/0175859 A1* | 8/2007 | Black | B81C 1/00031 216/41 |
| 2008/0257187 A1 | 10/2008 | Millward | |
| 2008/0311402 A1 | 12/2008 | Jung et al. | |
| 2009/0087653 A1 | 4/2009 | Nealey et al. | |
| 2009/0179002 A1 | 7/2009 | Cheng et al. | |
| 2009/0181171 A1 | 7/2009 | Cheng | |
| 2009/0260750 A1 | 10/2009 | Nealey | |
| 2011/0147983 A1 | 6/2011 | Cheng et al. | |
| 2012/0135159 A1 | 5/2012 | Xiao et al. | |
| 2012/0202017 A1 | 8/2012 | Nealey et al. | |
| 2013/0189504 A1* | 7/2013 | Nealey | B82Y 30/00 428/201 |
| 2013/0209344 A1 | 8/2013 | Chang | |
| 2013/0209694 A1* | 8/2013 | Chang | B05D 3/02 427/379 |
| 2013/0209696 A1 | 8/2013 | Sharma et al. | |
| 2013/0209755 A1 | 8/2013 | Hustad et al. | |
| 2014/0141375 A1 | 5/2014 | Cho | |
| 2014/0142249 A1 | 5/2014 | Cho | |
| 2014/0142252 A1 | 5/2014 | Cho | |
| 2014/0227448 A1* | 8/2014 | Trefonas | C09D 153/00 427/385.5 |
| 2014/0273511 A1 | 9/2014 | Farrell et al. | |
| 2014/0287266 A1* | 9/2014 | Watanabe | G11B 5/743 428/800 |
| 2014/0349486 A1* | 11/2014 | Sills | B81C 1/00031 438/700 |
| 2014/0377518 A1 | 12/2014 | Trefonas, III et al. | |
| 2014/0378592 A1 | 12/2014 | Trefonas, III et al. | |
| 2015/0184024 A1 | 7/2015 | Chang | |
| 2015/0240110 A1 | 8/2015 | Willson et al. | |
| 2016/0024246 A1 | 1/2016 | Mahanthappa et al. | |
| 2016/0186001 A1 | 6/2016 | Hustad et al. | |
| 2016/0186002 A1 | 6/2016 | Hustad et al. | |
| 2016/0186004 A1 | 6/2016 | Hustad et al. | |
| 2016/0251508 A1 | 9/2016 | Hustad et al. | |
| 2016/0251538 A1 | 9/2016 | Hustad et al. | |
| 2016/0251539 A1 | 9/2016 | Hustad et al. | |
| 2016/0254141 A1 | 9/2016 | Hustad et al. | |

FOREIGN PATENT DOCUMENTS

| | | |
|---|---|---|
| KR | 20110018678 A | 2/2011 |
| TW | I460530 B | 11/2014 |
| WO | 2013011314 A1 | 1/2013 |

OTHER PUBLICATIONS

Mitra et al.; "Thin Film Phase Behavior of Bottlebrush/Linear Polymer Blends"; Macromolecules; 47; 2014, pp. 5269-5276.
Verduzco et al.; "Structure, function, self-assembly, and applications of bottlebrush copolymers"; Chem. Soc. Rev.;44; 2015, pp. 2405-2420.
Bosse, et al. "Microdomain Ordering in Laterally Confined Block Copolymer Thin Films", Macromolecules 40, 9570 (2007).
Grimaud, et al. "Controlled/"Living" Radical Polymerization of Methyl Methacrylate by Atom Transfer Radical Polymerization" in Macromolecules 1997, 30, 2216-2218.
Gu, et al. "Self-Assembly of Symmetric brush Diblock Copolymers", ACS Nano, 7(3), 2551, 2013.
Gurr, et al., "Polyimide polydimethylsiloxane triblock copolymers for thin film composite gas separation membranes" J Polym Sci Pol Chem 2014, 52, 3372-3382.
Han, et al., "Effect of Composition of Substrate-Modifying Random Copolymers on the Orientation of Symmetric and Asymmetric Diblock Copolymer Domains," Macromolecules, 2008, 41 (23), pp. 9090-9097.
Hong, et al. "On the Self-Assembly of Brush Block Copolymers in Thin Films", ACS Nano, 7(11), 9684, 2013.
Iwama, et al. "Computational Studies of Shape Rectification in Directed Self-Assembly", Proc. SPIE, 9049, 904927 (2014).
Iwama, et al. "The Hole Shrink Problem: Directed Self-Assembly Using Self-Consistent Field Theory", J. Photopolymer Science & Technology 26, 15-20 (2013).
Ji, et al. "Molecular Transfer Printing Using Block Copolymers" ACS Nano, 2010, 4 (2), pp. 599-609.
Ji, et al. "Preparation of neutral wetting brushes for block copolymer films from homopolymer blends", Advanced Materials, 2008, 20, 3054-3060.
Kim, B. "Defectivity Study of Directed Self-Assembly of Cylindrical Diblock Copolymers in Laterally Confined Thin Channels", Proc. of SPIE, 8680, 868016 (2013).
Kim, B. et al. "Thermodynamic and Kinetic Aspects of Defectivity in Directed Self-Assembly of Cylinder-Forming Diblock Copolymers in Laterally Confining Thin Channels", J. Appl. Polym. Sci., 131, 40790 (2014).
Laachi et al. "Field-Theoretic Simulations of Directed Self-Assembly in Cylindrical Confinement: Placement and Rectification Aspects", Proc. SPIE, 9049, 90491M (2014).
Laachi, et al. "Directed Self-Assembly of Diblock Copolymers in Laterally Confining Channels: Effect of Rough Surfaces on Line-Edge Roughness (LER) and Defectivity", Proc. SPIE, 9049, 90491D (2014).
Laachi, et al. "The Hole Shrink Problem: Theoretical Studies of Directed Self-Assembly in Cylindrical Confinement", Proc. of SPIE 8680, 868014 (2013).
Le, D., et al. "Synthesis of Well-Defined ω-Oxanorbornenyl Poly(ethylene oxide) Macromonomers via Click Chemistry and Their Ring-Opening Metathesis Polymerization" Macromolecules 2010, 43, 5611-5617.
Liu, et al. "Fabrication of Lithographically Defined Chemically Patterned Polymer Brushes and Mats" Macromolecules, 2011, 44 (7), pp. 1876-1885.
Macfarlane, et al. "Improving Brush Polymer Infrared 1-D Photonic Crystals via Linear Polymer Additives", J. Am. Chem. Soc., 2014, 136 (50), pp. 17374-17377.
Mansky, et al "Controlling Polymer-Surface Interactions with Random Copolymer Brushes" Science 1997, 275 (5305), 1458-1460.
Mansky, et al. "Ordered Diblock Copolymer Films on Random Copolymer Brushes"Macromolecules 1997, 30 (22), 6810-6813.
Takahashi, et al. "Defectivity in Laterally Confined Lamella-Forming Diblock Copolymers: Thermodynamic and Kinetic Aspects", Macromolecules 45, 6253-6265 (2012).
Trefonas, et al. "Bottom-up/top-down, high-resolution, high-throughput lithography using vertically assembled block bottle brush polymers" J. Micro/Nanolith. MEMS MOEMS. 12(4), 043006 (Dec. 16, 2013).
Edwards et al.; "Precise Control over Molecular Dimensions of Block-Copolymer Domains Using the Interfacial Energy of Chemically Nanopatterned Substrates"; Adv. Mater.; 16, No. 15; Aug. 4, 2004, 1315-1319.
Kim et al.; "Epitaxial self-assembly of block copolymers on lithographically defined nanopatterned substrates"; Nature; vol. 424; Jul. 24, 2003, p. 411-414.
Ruiz et al.; "Density Multiplication and Improved Lithography by Directed Block Copolymer Assembly"; Science; vol. 321; Aug. 15, 2008, pp. 936-939.
Laachi, et al. "Self-Consistent Field Theory Investigation of Directed Self-Assembly in Cylindrical Confinement", J. Polym. Sci. B Polym. Phys.; 2015, 12 pages.
Borah et al.; "Orientation and Alignment Control of Microphase-Separated PS-b-PDMS Substrate Patterns via Polymer Brush Chemistry"; ACS Appl. Mater. Interfaces; 5; 2013, 88-97.

* cited by examiner

COPOLYMER FORMULATION FOR DIRECTED SELF ASSEMBLY, METHODS OF MANUFACTURE THEREOF AND ARTICLES COMPRISING THE SAME

CROSS REFERENCE TO RELATED APPLICATION

This US Non-Provisional application claims the benefit of U.S. Provisional Application Ser. No. 62/097,679 filed 30 Dec. 2014, the entire contents of which are hereby incorporated by reference.

BACKGROUND

This disclosure relates to a copolymer formulation for directed self-assembly, methods of manufacture thereof and to articles comprising the same.

Directed self-assembly (DSA) of block copolymers has been identified as a candidate technology to extend the state of current optical lithography. In DSA, small pitch sizes are achieved by directing the self-assembled block copolymer nanodomains to a lithographically patterned substrate. One of the leading methods today for DSA involves a chemical pattern to align a lamellar morphology of a block copolymer, such as polystyrene-block-poly(methyl methacrylate), or PS-b-PMMA. The preferred process scheme, shown in FIG. 1, begins by patterning an array of sparse guide stripes generally manufactured from a crosslinked polystyrene mat. After the stripes are etched (also termed "etch trimming") to the proper dimension, the brush is coated over the stripes, baked to induce chemical grafting, and then excess brush is removed by rinsing to leave relatively flat substrate with chemical contrast. The substrate is then treated with a block copolymer, which after annealing aligns to the substrate to multiply the density of the initial pattern. In this two-step method that involves first applying the brush followed by applying the block copolymer (BCP), the composition of the brush has to be controlled over a fairly tight range in order to achieve good DSA results.

It is therefore desirable to use compositions where the alignment between domains can be easily achieved and where the ranges of the polymers are not so tightly controlled.

SUMMARY

Disclosed herein is a composition comprising a block copolymer; where the block copolymer comprises a first polymer and a second polymer; where the first polymer and the second polymer of the block copolymer are different from each other and the block copolymer forms a phase separated structure; and an additive polymer; where the additive polymer comprises a reactive moiety that is reacted to a substrate upon which it is disposed; and where the additive polymer comprises a homopolymer that is the chemically and structurally the same as one of the polymers in the block copolymer or where the additive polymer comprises a random copolymer that has a preferential interaction with one of the blocks of the block copolymer.

Disclosed herein is a method comprising disposing upon a substrate a composition comprising a block copolymer; where the block copolymer comprises a first polymer and a second polymer; where the first polymer and the second polymer of the block copolymer are different from each other and the block copolymer forms a phase separated structure; an additive polymer; where the additive polymer comprises a reactive moiety that is operative to react with a substrate upon which it is disposed; and where the additive polymer comprises a homopolymer that is the chemically and structurally the same as one of the polymers in the block copolymer or where the additive polymer comprises a random copolymer that has a preferential interaction with one of the blocks of the block copolymers; and a solvent; and annealing the composition to facilitate bonding or complexation or coordination of the additive polymer to the substrate and domain separation between the first polymer and the second polymer of the block copolymer to form a morphology of periodic domains formed from the first polymer and the second polymer; where a longitudinal axis of the periodic domains are parallel to the substrate.

Disclosed herein too are articles manufactured from the aforementioned composition.

DETAILED DESCRIPTION

Figure 1:
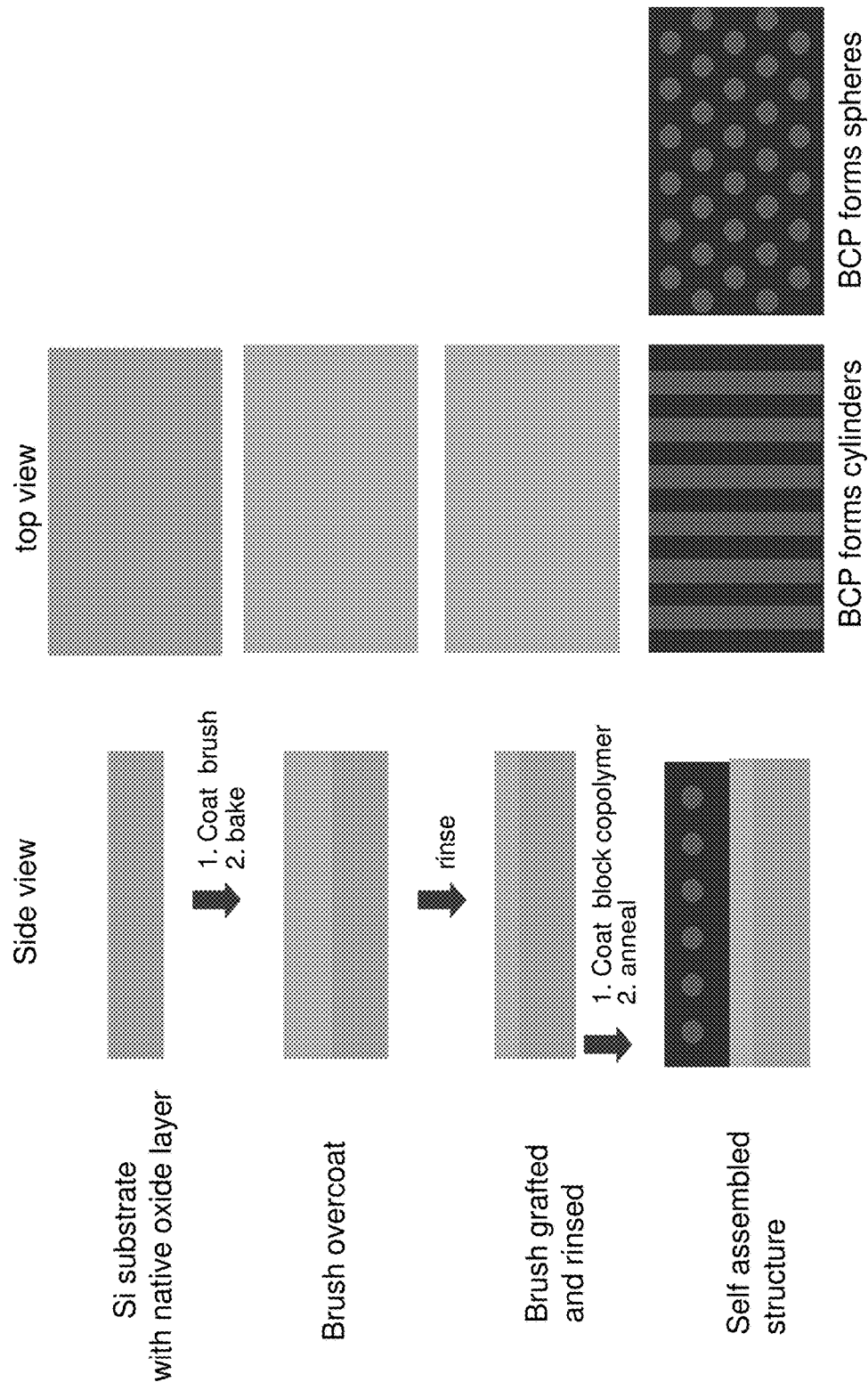
FIG. 1 is a schematic depiction of a prior art method of patterning a substrate by first applying the brush followed by applying the block copolymer, which forms a pattern of lines when the block copolymer has a cylindrical morphology and dots or holes when the block copolymer has a spherical morphology.

As used herein, "phase-separate" refers to the propensity of the blocks of block copolymers to form discrete microphase-separated domains, also referred to as "microdomains" or "nanodomains" and also simply as "domains". The blocks of the same monomer aggregate to form periodic domains, and the spacing and morphology of domains depends on the interaction, size, and volume fraction among different blocks in the block copolymer. Domains of block copolymers can form during application, such as during a spin-casting step, during a heating step, or can be tuned by an annealing step. "Heating", also referred to herein as "baking", is a general process wherein the temperature of the substrate and coated layers thereon is raised above ambient temperature. "Annealing" can include thermal annealing, thermal gradient annealing, solvent vapor annealing, or other annealing methods. Thermal annealing, sometimes referred to as "thermal curing" can be a specific baking process for fixing patterns and removing defects in the layer of the block copolymer assembly, and generally involves heating at elevated temperature (e.g., 150° C. to 400° C.), for a prolonged period of time (e.g., several minutes to several days) at or near the end of the film-forming process. Annealing, when performed, is used to reduce or remove defects in the layer (referred to as a "film" hereinafter) of microphase-separated domains.

The self-assembling layer comprising a block copolymer having at least a first polymer derived from polymerization of a first monomer and a second polymer derived from polymerization of a second monomer that forms domains through phase separation. "Domain", as used herein, means a compact crystalline, semi-crystalline, or amorphous region formed by corresponding blocks of the block copolymer, where these regions may be lamellar, cylindrical, or spherical and are form nanoscale patterns when disposed as thin films on substrates. Where a monolayer of cylinders form parallel to the plane of the substrate (in the x-y plane of the substrate), a nanoscale line pattern is apparent when viewing the film along the perpendicular (z) axis. Similarly, a monolayer film of a spherical block copolymer forms nanoscale hole or post patterns. Therefore, to form a useful pattern, control of the orientation of the self-assembled microdomains in the block copolymer is desirable. In an embodiment, the domains may have an average largest dimension of about 1 to about 25 nanometers (nm), specifically about 5 to about 22 nm, and still more specifically about 7 to about 20 nm.

The term "$M_n$" used herein and in the appended claims in reference to a block copolymer of the present invention is the number average molecular weight of the block copolymer (in g/mol) determined according to the method used herein in the Examples.

The term "$M_w$" used herein and in the appended claims in reference to a block copolymer of the present invention is the weight average molecular weight of the block copolymer (in g/mol) determined according to the method used herein in the Examples.

The term "PDI" or "Đ" used herein and in the appended claims in reference to a block copolymer of the present invention is the polydispersity (also called polydispersity index or simply "dispersity") of the block copolymer determined according to the following equation:

$$PDI=M_w/M_n.$$

The transition term "comprising" is inclusive of the transition terms "consisting of" and "consisting essentially of".

The term "and/or" is used herein to mean both "and" as well as "or". For example, "A and/or B" is construed to mean A, B or A and B.

The terms "brush" or "additive polymer" are used herein to describe a polymer containing a reactive functional group that capable of reacting with a functional group upon the surface of the substrate to form a layer of polymer chains attached to the substrate. The terms "mat" or "mat-like film" are used to describe a polymeric layer on a substrate formed by disposing a polymer having reactive substituents along the chain backbone capable of reacting either with itself or a crosslink-inducing additive to form bonds or crosslinks between individual chains of the polymer after it is disposed upon the substrate. An additive polymer is one where the chain backbone is oriented perpendicular to the substrate while a mat polymer is one where the chain backbone is oriented parallel to the substrate.

A random copolymer as used herein comprises two or more polymers where each polymer may comprise a single unit or a plurality of successive repeat units along the copolymer chain back bone. Even though some of the units along the copolymer chain backbone exist as single units, these are referred to as polymers herein. For example, the random copolymer referred to herein is detailed as comprising a third polymer and a fourth polymer even though the third polymer may exist as single units in certain segments along the copolymer chain backbone.

Disclosed herein is a composition (also referred to herein sometimes as a solution) comprising a block copolymer and an additive polymer that facilitates directed self-assembly of the polymer domains, where the polymer domains are formed parallel to a surface of a substrate upon which the block copolymer is disposed. In an embodiment, the composition comprises an intimate mixture of the complete volumes of the block copolymer and the additive polymer without either the block copolymer and the additive polymer undergoing phase separation. In another embodiment, the composition comprises a solvent in addition to the block copolymer and the additive polymer. The solvent is compatible with one or both of the block copolymer and the additive polymer.

The block copolymer comprises a first polymer and a second polymer, while the additive polymer may comprise either a single polymer or multiple polymers that are covalently bonded to a reactive group. The reactive group can react with the substrate to form a bond (e.g., a covalent linkage) or otherwise a complex or a coordinate (e.g. hydrogen or ionic bond) to the substrate to function as a additive polymer. In an embodiment, in order to produce horizontal domains, the additive polymer comprises a polymer that has a preferential interaction with one of the blocks of the block copolymer. This can be accomplished by either using an additive polymer that comprises a homopolymer that is the chemically and structurally the same as one of the polymers in the block copolymer or by using an additive polymer that comprises a homopolymer or copolymer that has a preferential interaction with one of the blocks of the block copolymers.

Prior to being disposed on the substrate, the entire volume of the additive polymer (with the reactive group being in an unreacted state i.e., it is not reacted with the substrate) and the entire volume of the block copolymer are intimately mixed together with a solvent in a vessel and in this blended state the domains of the block copolymer are not segregated (i.e., they are not phase separated) from each other or from the additive polymer. After being disposed on the substrate, the additive polymer segregates from the block copolymer and reacts with the substrate. In addition, the domains of the block copolymer phase separate from each other to form a nanoscale pattern of lines or holes/posts.

When the domains of the block copolymer phase separate to form cylinders, the longitudinal axis of the cylinders can be parallel to the substrate or perpendicular to the substrate. In an exemplary embodiment, the longitudinal axes of the domains of the phase separated block copolymer are parallel to the surface of the substrate upon which it is disposed (i.e., they are horizontally disposed).

The additive polymer functions as a substrate modification layer of the FIG. 1 and enables the separation of the block copolymer into cylindrical or spherical domains after the composition is disposed on a substrate. By mixing the additive polymer with the block polymer prior to deposition on a substrate that is to be etched, the additive polymer functions as an embedded substrate modification layer—i.e., it separates from the composition after deposition on a substrate and the reactive group reacts with the substrate. By having the additive polymer comprise a polymer that comprises a homopolymer that is the chemically and structurally the same as one of the polymers in the block copolymer or by using an additive polymer that comprises a homopolymer or copolymer that has a preferential interaction with one of the blocks of the block copolymers, the composition can facilitate directed self-assembly of the polymer domains when cast upon a substrate. The mixing of the additive polymer with the block copolymer prior to deposition on a substrate permits the use of a one-step process for manufacturing patterns on substrates.

The one step manufacturing process does not require two or more steps comprising the disposing of a polymeric brush on the substrate followed by baking of the substrate and then disposing a block copolymer on the brush copolymer.

Disclosed herein too is a method of using the aforementioned composition to facilitate the directed self-assembly of the polymer domains of the composition. The method comprises blending the additive polymer and the block copolymer together and applying them in a single coating and annealing step or alternatively, in a series of coating and annealing steps. This method is versatile and robust in that it permits a range of compositions (e.g., a range of polymer molecular weights and a range of weight percents) to be used for the block and additive polymers, while providing for better domain alignment than that which can be achieved by the process depicted in the FIG. 1. Surprisingly, this process not only simplifies the process by reducing the number of coat and bake steps, but the process window to achieve good directed self assembly is significantly improved over the two-step process that is detailed in the FIG. 1 and that is presently used in industry.

As detailed above, the composition includes a block copolymer and an additive polymer where the polymers that form the block copolymer are either similar or substantially similar in chemical character to the polymers that are used in the additive polymer or where one of the blocks of the block copolymer has a preferential interaction with the additive polymer.

The first polymer and the second polymer are chemically different from one another and are arranged in blocks in the block copolymer. The block copolymer can be a multiblock copolymer. In one embodiment, the multiblocks can include diblocks, triblocks, tetrablocks, and so on. The blocks can be part of a linear copolymer, a branched copolymer where the branches are grafted onto a backbone (these copolymers are also sometimes called "comb copolymers"), a star copolymer, or the like. The blocks can also be arranged in gradients, where the blocks are arranged in increasing molecular weight from one end of the polymer chain to the other end. In an exemplary embodiment, the block copolymer is a linear diblock copolymer.

The additive polymers are functionalized with a reactive group to facilitate bond formation or complexation or coordination with the substrate that the composition is disposed on. The reactive groups are detailed below.

By having the additive polymer comprise a homopolymer that is chemically and structurally the same as one of the polymers in the block copolymer or by using an additive polymer that comprises homopolymer or copolymer that has a preferential interaction with one of the blocks of the block copolymers, the composition can facilitate directed self-assembly of the polymer domains when cast upon a substrate.

The Block Copolymer

In an exemplary embodiment, when the composition is disposed upon a substrate it produces an etch resistant cylindrical or spherical morphology (i.e., etch resistant cylinders or spheres) in a matrix. The cylinders are horizontally oriented—i.e. they are parallel to the surface of the substrate upon which the composition is disposed. The additive polymer comprises at least one polymer and at least one polymer contained in the additive polymer is different in composition (chemical composition and structure) from the polymers contained in the block copolymer. The additive polymer contains at least one moiety that permits it to be covalently bonded or complexed or coordinated to the substrate.

In one embodiment, the block copolymer comprises a first polymer and a second polymer that are covalently bonded together, where at least one of the blocks is etch resistant, while the additive polymer contains a reactive moiety that permits it to be reactively bonded or complexed or coordinated to the substrate.

The reactive moiety is covalently bonded to the additive polymer. The first polymer of the copolymer generally contains less than 10 atomic percent silicon, specifically less than 5 atomic percent, more specifically less than 2 atomic percent, while the second polymer contains at least 10 atomic percent silicon, specifically at least 20 atomic percent silicon, and more specifically at least 30 atomic percent silicon. In an embodiment, the block copolymer comprises a polysiloxane, while the additive polymer contains at least one moiety that permits it to be covalently bonded to the substrate.

The first polymer of the copolymer and the second polymer of the copolymer both have a narrow polydispersity index and as a result form block copolymers that display a high degree of periodicity. The copolymers have cylindrical or spherical morphologies and can align parallel to the surface of a substrate upon which they are disposed, thus making them useful for advanced semiconductor patterning. These block copolymers can be used for creating features on a substrate (upon which they are disposed) that are less than or equal to about 50 nanometers, specifically less than or equal to about 40 nanometers. The block copolymer can be further treated via annealing to self-assemble into morphologies that display improved long range order. This feature advantageously permits the block-copolymer to be used as a photoresist with variable interdomain spacings for different lithographic applications.

The block copolymer can be a multiblock copolymer. In one embodiment, the multiblocks can include diblocks, triblock, tetrablocks, and so on. The blocks can be part of a linear copolymer, a branched copolymer where the branches are grafted onto a backbone (these copolymers are also sometimes called "comb copolymers"), a star copolymer, or the like. In an exemplary embodiment, the block copolymer is a linear diblock copolymer.

The first polymer or the second polymer of the block copolymer can comprise a polymer derived from monomers of, for example, a vinyl aromatic monomer, an ethylenically unsaturated monomer, 1-butene, 1,3-butadiene, isoprene, vinyl acetate, dihydropyran, norbornene, maleic anhydride, alkylene oxides, lactones, lactams, epoxides, siloxane, or the like, or a combination comprising at least one of the foregoing monomers. When the first polymer contains a silicon-containing moiety, it is present in an amount of less than 10 atomic percent, specifically less than 5 atomic percent, and more specifically less than 2 atomic percent.

Exemplary block copolymers that are contemplated for use in the composition include diblock or triblock copolymers such as poly(styrene-b-vinyl pyridine), poly(styrene-b-butadiene), poly(styrene-b-isoprene), poly(styrene-b-methyl methacrylate), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-dimethylsiloxane), poly(styrene-b-trimethylsilylmethyl methacrylate), poly(methyl methacrylate-b-dimethylsiloxane), poly(methyl methacrylate-b-trimethylsilylmethyl methacrylate), or the like, or a combination comprising at least one of the foregoing block copolymers.

In an embodiment, the first polymer of the block copolymer and of the additive polymer (when it is a random copolymer) is a vinyl aromatic polymer (e.g., polystyrene or its derivatives), while the second polymer is an ethylenically unsaturated polymer (e.g., an acrylate polymer or its derivatives). The first polymer is derived from a vinyl aromatic monomer having the structure of formula (1):

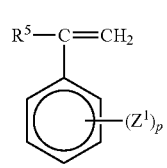

(1)

wherein $R^5$ is hydrogen, an alkyl or halogen; $Z^1$ is hydrogen, halogen, a hydroxyl or an alkyl; and p is from 1 to about 5.

The vinyl aromatic monomers that can be polymerized to produce the first polymer of the copolymer of the block copolymer and/or of the additive polymer are styrenes, alkylstyrenes, hydroxystyrenes or chlorostyrenes. Examples of suitable alkylstyrenes are o-methylstyrene, p-methylstyrene, m-methylstyrene, α-methylstyrene, o-ethylstyrene, m-ethylstyrene, p-ethylstyrene, α-methyl-p-methylstyrene, 2,4-dimethylstyrene, p-tert-butylstyrene, 4-tert-butylstyrene, or the like, or a combination comprising at least one of the foregoing alkylstyrene monomers. An exemplary first polymer (for both the block copolymer and the additive polymer) is polystyrene or poly(4-tert-butylstyrene).

The ethylenically unsaturated monomer can be an acrylate or a methacrylate. In one embodiment, the first polymer has a structure derived from an acrylate monomer represented by formula (2):

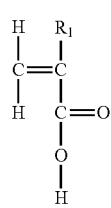

(2)

where $R_1$ is a hydrogen or an alkyl group having 1 to 10 carbon atoms. Examples of the first repeat monomer are acrylates and alkyl acrylates such as α-alkyl acrylates, methacrylates, ethacrylates, propyl acrylates, or the like, or a combination comprising at least one of the foregoing acrylates.

In one embodiment, the first polymer has a structure derived from a monomer having a structure represented by the formula (3):

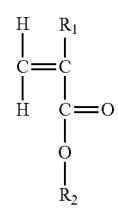

(3)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group. Examples of the alkyl (α-alkyl) acrylates are methacrylate, ethacrylate, propyl acrylate, (meth)acrylate monomers, methyl (meth)acrylate, ethyl (meth)acrylate, n-propyl (meth)acrylate, isopropyl (meth)acrylate, n-butyl (meth)acrylate, isobutyl (meth) acrylate, n-pentyl (meth)acrylate, isopentyl (meth)acrylate, neopentyl (meth)acrylate, n-hexyl (meth)acrylate, cyclohexyl (meth)acrylate, isobornyl (meth)acrylate, hydroxyethyl (meth)acrylate, or the like, or a combination comprising at least one of the foregoing acrylates. The term "(α-alkyl)acrylate" implies that either an acrylate or (α-alkyl)acrylate is contemplated unless otherwise specified.

In one embodiment, the first polymer is derived from a monomer that has at least one fluorine atom substituent and has a structure represented by the formula (4):

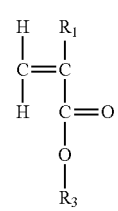

(4)

where $R_1$ is a hydrogen or an alkyl group having 1 to 10 carbon atoms and $R_3$ is a $C_{2-10}$ fluoroalkyl group. Examples of compounds having the structure of formula (4) are trifluoroethyl methacrylate, and dodecafluoroheptylmethacrylate. An exemplary ethylenically unsaturated monomer for the first polymer of the copolymer is methyl methacrylate. An exemplary first polymer of the block copolymer is polymethylmethacrylate.

The second polymer of the copolymer can comprise a polymer derived from monomers of, for example, a vinyl aromatic monomer, an ethylenically unsaturated monomer, 1-butene, 1,3-butadiene, isoprene, vinyl acetate, dihydropyran, norbornene, maleic anhydride, siloxane, or the like, or a combination comprising at least one of the foregoing monomers. The second contains a silicon-containing moiety present in an amount of at least 10 atomic percent silicon, specifically at least 20 atomic percent silicon and more specifically at least 30 atomic percent silicon.

The vinyl aromatic monomer of the second polymer can be a styrene, an alkylstyrene, or a combination thereof, bearing a silicon moiety. The vinyl aromatic monomers are polymerized to produce the first polymer of the block copolymer. Examples of suitable silicon-containing alkylstyrenes are 4-trimethylsilylstyrene, 4-(trimethylsilylmethyl)styrene, trimethyl(4-vinylphenoxy)silane, p-(t-butyldimethylsiloxy)styrene, styryl-based polyhedral oligosilsesquioxanes such as methacryloxypropylheptaisobutyl-T8-silsequioxane, and the like.

In one embodiment, the second polymer has a structure derived from a monomer having a structure represented by the formula (5):

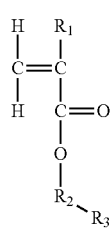

(5)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group, and $R_3$ is a silicon containing group. Examples of these monomers include methacryloxymethyltris(trimethylsiloxy)silane, methacryloxypropylpentamethyldisiloxane, methacryloxymethyl)bis(trimethylsiloxy) methylsilane, bis(trimethylsilyl)methyl methacrylate, (trimethylsilyl)methyl methacrylate, methacryloxypentamethyldisiloxane, methacryloxymethylphenethyltris(trimethylsiloxy)silane, methacryloxyethoxytrimethylsilane, (methacryloxymethyl)dimethylethoxysilane, methacryloxypropylheptaisobutyl-T8-silsesquioxane, (methacryloxymethyl)phenyldimethylsilane, In one embodiment, the second polymer has a structure derived from a monomer having a structure represented by the formula (6):

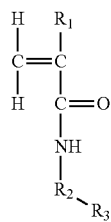

(6)

where $R_1$ is a hydrogen or an alkyl group having 1 to 10 carbon atoms and $R_2$ is a $C_{1-10}$ alkyl, a $C_{3-10}$ cycloalkyl, or a $C_{7-10}$ aralkyl group, and $R_3$ is a silicon containing group. An example of these monomers includes methacrylamidopropylbis(trimethylsiloxy)methylsilane.

In one embodiment, the second polymer is derived from a siloxane monomer having the structure of formula (7)

(7)

wherein each R is independently a $C_1$-$C_{10}$ alkyl, a $C_3$-$C_{10}$ cycloalkyl, a $C_6$-$C_{14}$ aryl, a $C_7$-$C_{13}$ alkylaryl or a $C_7$-$C_{13}$ arylalkyl. Combinations of the foregoing R groups can be present in the same monomer. The degree of polymerization n in the formula (4) can be 25 to 5,000, specifically 30 to 3,000, more specifically 50 to 1,000. The polysiloxane is the second polymer is generally present in an amount of greater than 15 atomic percent, specifically greater than 35 atomic percent, specifically greater than 50 atomic percent, and more specifically greater than 80 atomic percent, based on the total atomic weight of the second polymer. In another embodiment, the second polymer is derived from vinyl trimethylsilane or dimethylsilabutane.

In an exemplary embodiment, the second polymer comprises a polydimethylsiloxane having a number average molecular weight of 10,000 to 80,000 grams per mole, specifically 15,000 to 40,000 grams per mole.

The first polymer and the second polymer are present in amounts that permit the formation of horizontal cylinders (i.e., a cylindrical morphology) or spheres (i.e., a spherical morphology) of the second polymer in the block copolymer when it is disposed upon the brush. The second polymer comprises about 5 to about 40 volume percent of the total volume of the copolymer. If a cylindrical composition is desired, the second polymer comprises about 15 to about 35 volume percent, and more specifically about 20 to about 30 volume percent of the total volume of the copolymer. In an exemplary embodiment, the second polymer comprises about 25 volume percent of the total volume of the copolymer.

If spheres (i.e., the spherical morphology) are desired, then the second polymer comprises about 5 to about 20 volume percent, specifically about 8 to about 15 of the total volume of the copolymer.

The polydispersity index of the block copolymer is less than or equal to about 1.20, specifically less than or equal to about 1.15 and specifically less than or equal to about 1.10 when determined by size exclusion chromatography (SEC) with tetrahydrofuran (THF) as the mobile phase (at 35° C. and a flow rate of 1 mL/min).

The weight average molecular weight of the block copolymer is about 3 to about 150, specifically about 7.5 to about 120, specifically about 10 to about 100, and more specifically about 15 to about 80 kilograms per mole as determined using multi-angle laser light scattering gel permeation chromatography and the polydispersity index. In an exemplary embodiment, it is desirable for the block copolymer to have a weight average molecular weight of about 3 to about 120 kilograms per mole.

The block copolymer has an interdomain spacing as measured by small angle xray scattering of less than or equal to about 60 nanometers, specifically less than or equal to about 50 nanometers, more specifically less than or equal to about 40 nanometers, and more specifically less than or equal to about 36 nanometers.

In an exemplary embodiment, the block copolymer is a poly(styrene)-block(b)-poly(alkylsiloxane), a poly(alkylstyrene)-b-poly(alkylsiloxane), or a combination thereof. In an exemplary embodiment, the poly(styrene)-block(b)-poly (alkylsiloxane) is poly(styrene)-b-poly(dimethylsiloxane), while the poly(alkylstyrene)-b-poly(alkylsiloxane) is poly(t-butylstyrene)-b-poly(dimethylsiloxane).

The poly(styrene)-b-poly(dimethylsiloxane) block copolymer or the poly(t-butylstyrene)-b-poly(dimethylsiloxane) block copolymer disclosed herein comprises a poly(styrene)-b-poly(dimethylsiloxane) block copolymer component (hereinafter PS-b-PDMS) or comprises a poly(t-butylstyrene)-b-poly(dimethylsiloxane) (hereinafter PtBS-b-PDMS), wherein the block copolymer component is selected from a single PS-b-PDMS or PtBS-b-PDMS block copolymer or from a blend of at least two different PS-b-PDMS or PtBS-b-PDMS block copolymers; wherein the average molecular weight of the PS-b-PDMS or PtBS-b-PDMS block copolymer component is 2 to 1,000 kg/mol, specifically 5 to 100; more specifically 6 to 60 kg/mol.

In one embodiment, the PS-b-PDMS or PtBS-b-PDMS block copolymer component is a single PS-b-PDMS or PtBS-b-PDMS block copolymer (not a blend of two block copolymers); wherein the average molecular weight (as defined hereinabove) of the PS-b-PDMS or PtBS-b-PDMS copolymer is 2 to 1,000 kg/mol (specifically 5 to 100 kg/mol; more specifically 6 to 60).

In another embodiment, the PS-b-PDMS or PtBS-b-PDMS component is a blend of at least two different PS-b-PDMS or PtBS-b-PDMS block copolymers; wherein the average molecular weight (as defined hereinabove) of the blend of PS-b-PDMS or PtBS-b-PDMS block copolymers is 25 to 1,000 kg/mol, specifically 30 to 1,000 kg/mol; more specifically 30 to 100; most specifically 30 to 60 kg/mol. In an exemplary embodiment, the PS-b-PDMS or PtBS-b-PDMS block copolymer component is a blend of at least two different PS-b-PDMS or PtBS-b-PDMS block copolymers; wherein the at least two different PS-b-PDMS or PtBS-b-PDMS block copolymers are selected from PS-b-PDMS or PtBS-b-PDMS block copolymers having a number average molecular weight, $M_n$, of 1 to 1,000 kg/mol; a polydispersity, PD, of 1 to 3, specifically 1 to 2, most specifically 1 to 1.2; and, a poly(dimethylsiloxane) weight fraction, $Wf_{PDMS}$, of 0.18 to 0.8, specifically 0.18 to 0.35 when the desired morphology comprises polydimethylsiloxane cylinders in a polystyrene matrix. It is to be noted that a block copolymer blend can comprise a PS-b-PDMS block copolymer and a PtBS-b-PDMS block copolymer.

The PS-b-PDMS or PtBS-b-PDMS block copolymer desirably has an overall molecular weight and polydispersity amenable to further processing. In an embodiment, the block copolymer has a weight-average molecular weight (Mw) of 10,000 to 200,000 g/mol. Similarly, the block copolymer has a number averaged molecular weight (Mn) of 5,000 to 200,000. The block copolymer can also have a polydispersity (Mw/Mn) of 1.01 to 6. In an embodiment, the polydispersity of the block copolymer is 1.01 to 1.5, specifically 1.01 to 1.2, and still more specifically 1.01 to 1.1. Molecular weight, both Mw and Mn, can be determined by, for example, gel permeation chromatography using a universal calibration method, and calibrated to polystyrene standards.

The PS-b-PDMS or PtBS-b-PDMS block copolymer further comprises a solvent. Solvents suitable for use in the PS-b-PDMS or PtBS-b-PDMS block copolymer include liquids that are able to disperse the PS-b-PDMS or PtBS-b-PDMS block copolymer component into particles or aggregates having an average hydrodynamic diameter of less than 50 nanometers (nm) as measured by dynamic light scattering. Specifically, the solvent used is selected from propylene glycol monomethyl ether acetate (PGMEA), ethoxyethyl propionate, anisole, ethyl lactate, 2-heptanone, cyclohexanone, amyl acetate, γ-butyrolactone (GBL), n-methylpyrrolidone (NMP) and toluene. More specifically, the solvent used is selected from propylene glycol monomethyl ether acetate (PGMEA) and toluene. Most specifically, the solvent used is toluene or propylene glycol monomethyl ether acetate.

The composition containing the block copolymer may optionally further comprise an additive. Additional polymers (including homopolymers and random copolymers); surfactants; antioxidants; photoacid generators; thermal acid generators; quenchers; hardeners; adhesion promoters; dissolution rate modifiers; photocuring agents; photosensitizers; acid amplifiers; plasticizers; and cross linking agents may also be added to the composition. Preferred additives for use in composition that contain PS-b-PDMS or PtBS-b-PDMS block copolymer include surfactants and antioxidants.

Additive Polymer

As noted above, the additive polymer is contained in the composition and comprises a reactive species that can covalently bond the additive polymer to the substrate. The additive polymer can be chosen such that it has a lower or higher surface energy than the block copolymer. By selecting a particular combination of an additive polymer and a block copolymer, the interdomain spacing between the etch resistant cylinders can be controlled. In addition, when disposed in a trench, the spacing between the trench walls and a surface of the etch resistant cylinders can be controlled. Control of the distance between the trench walls and the cylinder surface and the distance between the cylinders can be used to produce high quality semiconductors for use in electronic devices.

As noted above, the additive polymer comprises a polymer that has a preferential interaction with one of the blocks of the block copolymer. This can be accomplished by either using an additive polymer that comprises a homopolymer that is the chemically and structurally the same as one of the polymers in the block copolymer or by using an additive polymer that comprises a homopolymer or copolymer that has a preferential interaction with one of the blocks of the block copolymers.

In an embodiment, the additive polymer comprises a third polymer; where the third polymer is chemically identical with or substantially chemically similar to either the first polymer or the second polymer of the block copolymer. In another embodiment, the additive polymer is a copolymer that comprises a third polymer and a fourth polymer; where the third polymer and the fourth polymer of the additive polymer are different from each other; where the first polymer of the block copolymer is chemically identical with or substantially chemically similar to the third polymer of the additive polymer or where the second polymer of the block copolymer is chemically identical with or substantially chemically similar to the fourth polymer of the additive polymer.

When the additive polymer is a homopolymer it can comprise at least one of the polymers listed above. The additive polymer can also be either a block copolymer or a random copolymer. In an embodiment, the additive polymer has the structure of formula (7A) or (7B) below:

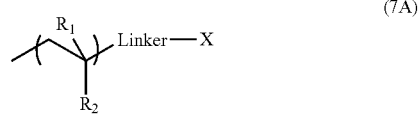

(7A)

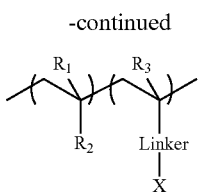

(7B)

where the reactive species X can, for example, be a hydroxyl group, a thiol group, an amine group, a carboxyl group, a silane group or an alkoxy groups, $R_1$, $R_2$ and $R_3$ can be the same or different and can be a hydrogen, a $C_{1-10}$ alkyl group, a $C_{1-10}$ alkyl ester group, a $C_{3-10}$ cycloalkyl ester group, a $C_{7-10}$ aralkyl ester group, a $C_6$-$C_{14}$ aryl, a $C_7$-$C_{13}$ alkylaryl or a $C_7$-$C_{13}$ arylalkyl group. Other groups may also be used for $R_1$, $R_2$ and $R_3$.

Examples of polymers and copolymers that can be used in the additive polymer are polystyrene, polysiloxane, polymethylmethacrylate, polyacrylate, polyvinylacetate, polydienes, polyethers including poly(alkylene oxides) such as poly(ethylene oxide), polypropylene oxide), poly(butylene oxide), or random or block copolymers of these; poly((meth)acrylates), polystyrenes, polyesters, polyamides, polyorganosiloxanes, polyorganogermanes, or the like.

In one embodiment, the blocks of the block copolymer comprise as monomers C2-30 olefinic monomers, (meth)acrylate monomers derived from $C_{1-30}$ alcohols, inorganic-containing monomers including those based on iron, silicon, germanium, tin, aluminum, titanium, or a combination comprising at least one of the foregoing monomers. In a specific embodiment, exemplary monomers for use in the blocks can include, as the $C_{2-30}$ olefinic monomers, ethylene, propylene, 1-butene, 1,3-butadiene, isoprene, vinyl acetate, dihydropyran, norbornene, maleic anhydride, styrene, 4-hydroxy styrene, 4-acetoxy styrene, 4-methylstyrene, or a-methylstyrene; and can include as (meth)acrylate monomers, methyl (meth)acrylate, ethyl (meth)acrylate, n-propyl (meth)acrylate, isopropyl (meth)acrylate, n-butyl (meth)acrylate, isobutyl (meth) acrylate, n-pentyl (meth)acrylate, isopentyl (meth)acrylate, neopentyl (meth)acrylate, n-hexyl (meth) acrylate, cyclohexyl (meth)acrylate, isobornyl (meth)acrylate, or hydroxyethyl (meth)acrylate. Combinations of two or more of these monomers can be used in the additive polymer so long as polymer(s) derived from any one of these monomers is not contained in the block copolymer that is disposed upon the additive polymer.

Exemplary blocks used in the additive polymer include styrene (i.e., polystyrene blocks), or (meth)acrylate homopolymeric blocks such as poly(methylmethacrylate); exemplary random blocks include, for example, blocks of styrene and methyl methacrylate (e.g., poly(styrene-co-methyl methacrylate)), randomly copolymerized; and an exemplary alternating copolymer block can include blocks of styrene and maleic anhydride which is known to form a styrene-maleic anhydride diad repeating structure due to the inability of maleic anhydride to homopolymerize under most conditions (e.g., poly(styrene-alt-maleic anhydride)). It will be understood that such blocks are exemplary and should not be considered to be limiting.

Exemplary additive polymers are hydroxyl terminated polystyrene, hydroxyl terminated polydimethylsiloxane, hydroxyl terminated poly(methylmethacrylate-random-trifluoroethylmethacrylate) (P(MMA-r-TFEMA)-OH), and hydroxyl terminated poly(methylmethacrylate-random-dodecafluoroheptylmethacrylate) (P(MMA-r-DFHMA)-OH).

In one embodiment, in using the composition comprising the additive polymer and the block copolymer, the composition is first disposed on the substrate. The substrate may be cleaned with a solvent prior to disposing the additive polymer on the substrate. Both the additive polymer and block copolymer may be subjected to purification steps prior to being mixed together in a solvent and then disposed upon the substrate. Purification may involve centrifugation, filtration, distillation, decantation, evaporation, treatment with ion exchange beads, and the like. Upon disposing the composition upon the substrate, the substrate is heated to facilitate a reaction between the additive polymer and the substrate.

In one embodiment, the composition may be dispersed/dissolved in a solvent prior to being disposed upon the substrate. A list of solvents is provided above and one or more of these solvents may be used to dissolve the additive polymer. Other solvents not found in this list may also be used. The composition may be disposed upon the substrate by spin coating, dip coating, spray coating, electrostatic painting, using a doctor blade, and the like.

The substrate with the composition (comprising the additive polymer and the block copolymer) disposed thereon may be subjected to annealing. The substrate with the composition disposed thereon is heated to a temperature of up to 400° C. for up to 4 hours to both remove solvent, facilitate separation of the additive polymer from the block copolymer, react the additive polymer with the substrate and promote phase separation (i.e., form the domains in an annealing process) of the blocks in the block copolymer.

In an exemplary embodiment, the block copolymer is disposed upon the substrate and heated to a temperature of 200 to 400° C., specifically 250 to 340° C. for 0.5 minutes to 2 hours, specifically 1 to 10 minutes. The annealing of the block copolymer can be used to vary the interdomain spacing (i.e., the periodicity) of the horizontal cylindrical domains. The size of the domains can also be varied by the temperature and time of the annealing.

Upon annealing, the cylindrical or spherical domains of the block copolymer form on the substrate with the first polymer in contact with the additive polymer on the substrate, and the second polymer forms a second domain in the form of a cylinder or sphere in the matrix of the first domain. Cylinder domains are therefore aligned parallel to the plane of the substrate. One of the domains of the block copolymer is then etched away. A relief pattern may then formed by removing either the first or second domain to expose an underlying portion of the additive polymer layer or underlying substrate. In an embodiment, removing is accomplished by a wet etch method, developing, or a dry etch method using a plasma such as an oxygen plasma. The block copolymer with at least one domain removed is then used as a template to decorate or manufacture other surfaces that may be used in fields such as electronics, semiconductors, and the like.

The block copolymer morphology can be used in combination with a graphoepitaxy directed self assembly scheme using a patterned surface to control the placement and orientation of the domains on the substrate. Patterned substrates include topographic features such as line and space patterns, trenches, holes, posts, and the like, and can be formed to direct the self-assembly to give a regular pattern with a dense pitch, i.e., a ratio of line width to space width of 1:1 or more (e.g., 1.1:1, 1.2:1, 1.5:1, 2:1, and the like), a semi-dense pitch of less than 1:1 (e.g., 1:1.5) or a sparse pattern having a pitch of 1:2 or less (e.g., 1:3, 1:4, and the like). The additive polymer separates to contact the bottom and/or sidewalls of these topographic features of the graphoepitaxy substrates to control domain alignment and feature dimensions.

Advantageously, use of lines or dashes with high line-edge roughness and line-width roughness is tolerated by this patterning method, as the domains upon forming can correct any defects of alignment in a "self-healing" mechanism during annealing.

In one embodiment, at least one microphase-separated domain is selectively removed to generate a topographical pattern, followed by pattern transfer from the topographic pattern to another substrate by a reactive ion etch process. The other substrate may be a semiconductor substrate. The above methods and structures may be used in the manufacture of semiconductor devices including memory devices requiring dense line/space patterns such as synchronous dynamic random access memory (SDRAM) or dense features for data storage such as in hard drives.

Figure 2:
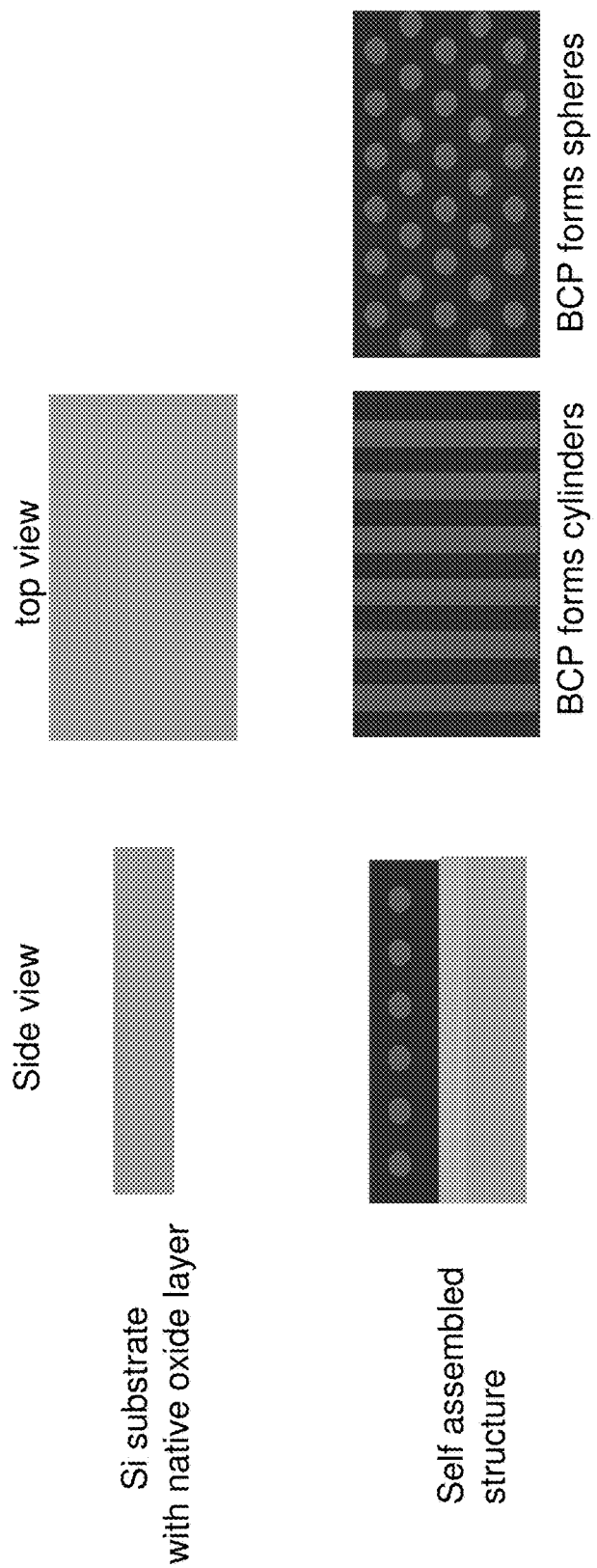
FIG. 2 is a schematic depiction of an exemplary method of patterning a substrate using the composition disclosed herein.
Figure 3:
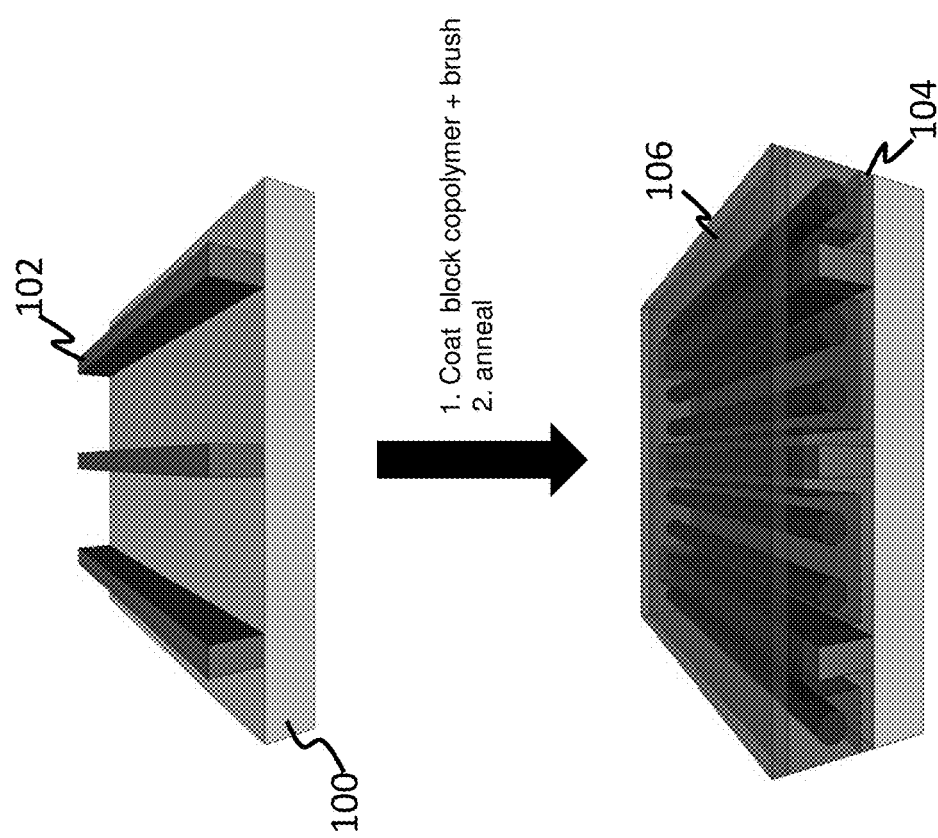
FIG. 3 is a schematic depiction of an exemplary method of patterning a substrate using the composition disclosed herein that involves domain alignment by applying the combination of brush and block copolymer to a patterned substrate of trenches which aligns its cylindrical morphology within the trench to form a line pattern.

The FIGS. 2 and 3 depict an exemplary method of patterning a substrate using the composition disclosed herein. A substrate 100 has disposed upon it lines 102 that act to confine and align the domains of the block copolymer. The composition comprising the block copolymer and the additive polymer is first mixed with a solvent and is then disposed upon the substrate 100. The substrate 100 with the composition disposed thereon is subjected to annealing. During the annealing process, the additive polymer 104 separates from the block copolymer 106 and contacts the surface in much the same manner as the brush copolymer did in the FIG. 1. The block copolymer 106 then undergoes phase separation into domains on the surface of the additive polymer 104.

The solvent that the composition is dissolved in prior to being disposed upon the substrate may be one of those listed above. Examples of useful solvents for compatibilizing the composition are propylene glycol monomethyl ether acetate, propylene glycol monomethyl ether, toluene, anisol, n-butylacetate, isobutylisobutyrate, benzyl benzoate, cyclohexanone, methyl-2-hydroxyIsobutryate, gamma-butyrolactone, propylene glycol ethyl ether, ethyl lactate, and the like. A preferred solvent is propylene glycol monomethyl ether acetate.

The domains of the block copolymer upon annealing form parallel to the substrate and the first polymer aligns to the topographic pattern on the substrate, and the second polymer forms a second domain on the substrate aligned adjacent to the first domain. One of the domains of the block copolymer (formed from either the first polymer of the copolymer or the second polymer of the copolymer) may then be preferentially etched away. A relief pattern is then formed by removing either the first or second domain to expose an underlying portion of the surface modification layer. In an embodiment, removing is accomplished by a wet etch method, developing, or a dry etch method using a plasma such as an oxygen plasma. The block copolymer with at least one domain removed is then used as a template to decorate or manufacture other surfaces that may be used in fields such as electronics, semiconductors, and the like.

The methods as disclosed allow for formation of self-assembling preparation of nanoscale structural features, and directional control of the nanopatterned features, by sequential deposition of the orientation control surface modification layer using often used solution coating techniques, providing greater control of the desired feature patterns, into different post-patterning processes useful for obtaining different topographies by substrate etch, and for the preparation of a wide variety of features in a wide variety of compositional or topographic substrates.

The composition and method of manufacturing disclosed herein are detailed in the following non-limiting examples. The invention is further illustrated by the following non-limiting examples.

EXAMPLES

The following materials were passed through a column packed with activated A-2 grade alumina before being used in the Examples herein, namely tetrahydrofuran (99.9% pure available from Aldrich), styrene (available from Aldrich), and cyclohexane (HPCL grade available from Fischer). PS-b-PDMS-1 (27 wt % PDMS, Mn=44 kg/mol), PS-b-PDMS-2 (27 wt % PDMS, Mn=9 kg/mol), PS-OH-1 (Mn=10 kg/mol), and PS-OH-2 (Mn=37 kg/mol) were made substantially as described by Trefonas et al. in U.S. Pat. No. 8,822,615. All the other materials used in the Examples herein were commercial materials that were used as received.

The film thicknesses reported in the Examples were measured using a NanoSpec/AFT 2100 Film Thickness Measurement tool. The thickness of the films were determined from the interference of a white light passed through a diffraction grating. A standard program called "Polyimide on Silicon" was used to analyze the component wavelengths (380-780 nm) to determine the film thickness. The thickness of the film of the deposited block copolymer composition and the additive polymer layer were measured together as one polymeric layer. The reported film thickness is the combined thickness of the deposited block copolymer composition and the additive polymer layer.

The number average molecular weight, $M_N$, and polydispersity values reported in the Examples were measured by gel permeation chromatography (GPC) on an Agilent 1100 series LC system equipped with an Agilent 1100 series refractive index and MiniDAWN light scattering detector (Wyatt Technology Co.). Samples were dissolved in HPLC grade THF at a concentration of approximately 1 mg/mL and filtered through at 0.20 µm syringe filter before injection through the two PLGel 300×7.5 mm Mixed C columns (5 mm, Polymer Laboratories, Inc.). A flow rate of 1 mL/min and temperature of 35° C. were maintained. The columns were calibrated with narrow molecular weight PS standards (EasiCal PS-2, Polymer Laboratories, Inc.).

Inverse-gated $^{13}C$ NMR spectroscopy was performed on a Bruker Avance 400 MHz NMR spectrometer equipped with a cryoprobe. Polymers were dissolved in $CDCl_3$ in 10 mm NMR tubes at room temperature. 0.02 M chromium acetylacetonate ($Cr(acac)_3$) was added to shorten the acquisition time. The typical sample concentration was 0.35 g/2.8 mL. All measurements were taken without sample spinning at 25° C., acquisition of 4000-8000 scans, relaxation delay of 5 s, 90° pulse length of 12.1 µs, spectrum reference of 77.27 ppm for $CDCl_3$, spectrum center at 100 ppm, and spectral width of 300 ppm.

The annealed films deposited in the Examples were examined using a D5000 Atomic Force Microscope. A 2 µm by 2 µm phase image was collected for each sample at a scan rate of 1 Hz (256×256 pixels). The images were analyzed with Scanned Probe Image Processor (SPIP v 6.0.4, Image Metrology, Denmark). The film pitch, $L_0$, reported in the Examples was determined using Fourier analysis (2D isotropic power spectral density) where the most intense peak in the spectrum representing the dominant spatial wavelength provides the pitch of the material.

Comparative Example A

Figure 4:
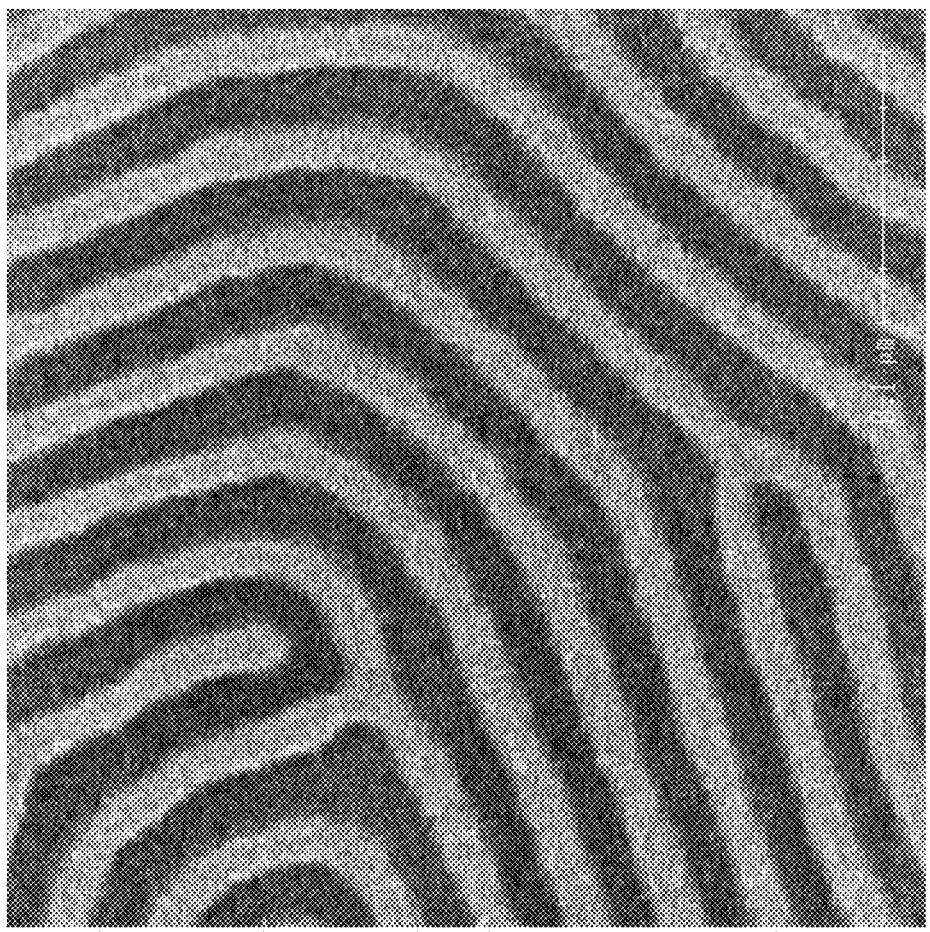
FIG. 4 depicts a scanning electron microscope image of a fingerprint pattern formed by the oxidized PDMS after applying the prior art process of first applying a PS-OH brush, then applying a PS-b-PDMS block copolymer with a cylindrical morphology.

This comparative example demonstrates a two coat directed self-assembly of a block copolymer of polystyrene and polydimethylsiloxane (PS-b-PDMS). A formulation forming a cylindrical morphology of PS-b-PDMS of 34 nm domain spacing (PS-b-PDMS-34) was prepared by blending PGMEA solutions of PS-b-PDMS-1 with PS-b-PDMS-2 in a 85:15 weight ratio at 1.22 wt % solution. A solution of PS-OH-1 (Mn=10 kg/mol) in PGMEA was prepared at 1.2 wt %. The PS-OH-1 solution was spin-coated at 1,500 rpm onto a silicon wafer with native oxide coating. The coated film was baked at 250° C. for 2 minutes under nitrogen and placed on a stainless steel block rapidly to be cooled to room temperature. The wafer was then rinsed with PGMEA by coating a puddle on the wafer and spinning dry after 30 seconds puddle time and then soft baked at 130° C. for 1 minute to remove residual solvent. The PS-brushed wafer was then coated with a thin film of PS-b-PDMS-34 by spin coating at 1,000 rpm, soft baked at 130° C. for 1 minute to remove residual solvent, and annealing at 340° C. for 2 minutes under nitrogen. Reactive ion etch was then performed using a Plasma Therm 790+ using a two-stage etch, first using a $CHF_3$ (50 sccm, 100 W, 10 mTorr pressure) to remove the top layer of PDMS followed by an oxygen etch to remove the PS and oxidize the PDMS (25 sccm, 180 W, 6 mTorr pressure). A representative SEM image of the pattern is shown in FIG. 4, which shows a fingerprint pattern formed by the oxidized PDMS.

Example 1

Figure 5:
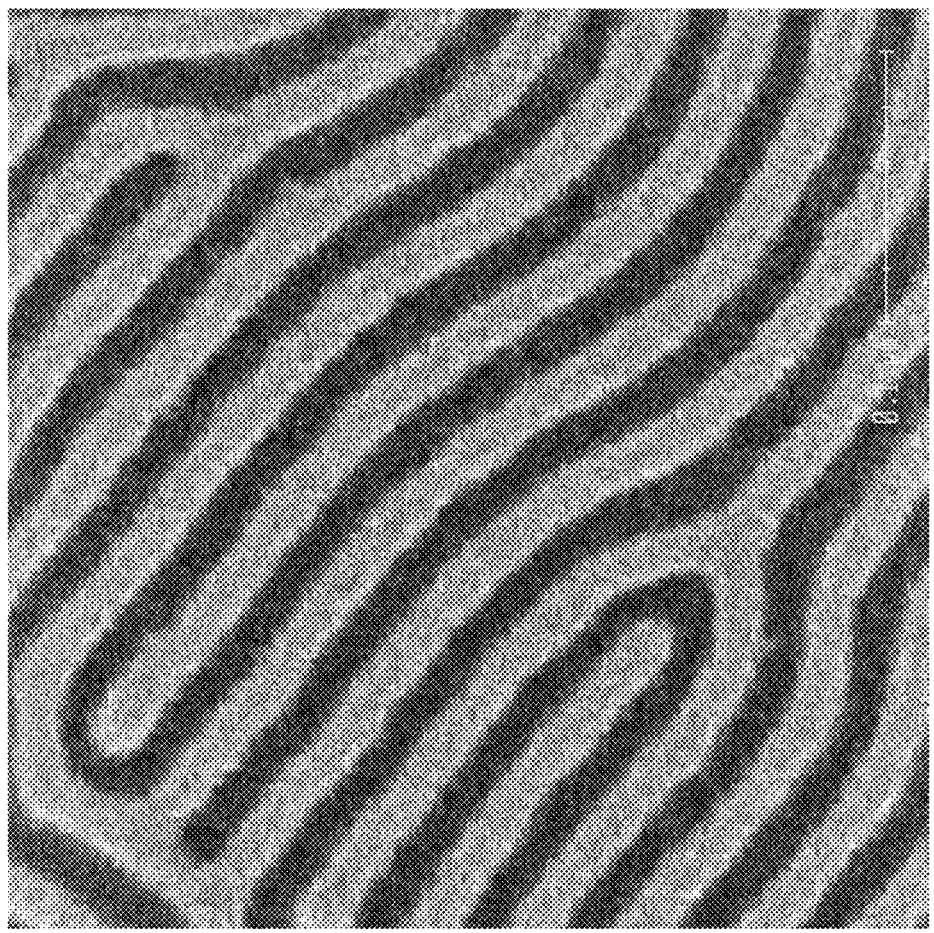
FIG. 5 depicts a scanning electron microscope image of a fingerprint pattern formed by the oxidized PDMS after applying the inventive process and composition of PS-OH brush mixed with the PS-b-PDMS block copolymer, with no degradation of the pattern relative to the two-step process.

A formulation forming a cylindrical morphology of PS-b-PDMS of 34 nm domain spacing (PS-b-PDMS-34) was prepared by blending PGMEA solutions of PS-b-PDMS-1 with PS-b-PDMS-2 in a 85:15 weight ratio at 1.22 wt % solution. PS-OH-1 (0.030 g), was added to 10 g of this solution to form a solution containing both the PS-b-PDMS-34 and PS-OH-1 brush. A silicon wafer with native oxide coating was coated with a thin film of the composition by spin coating at 1,000 rpm, soft baking at 130° C. for 1 minute to remove residual solvent, and annealing at 340° C. for 2 minutes under nitrogen. Reactive ion etch was then performed using a Plasma Therm 790+ using a two-stage etch, first using a $CHF_3$ (50 sccm, 100 W, 10 mTorr pressure) to remove the top layer of PDMS followed by an oxygen etch to remove the PS and oxidize the PDMS (25 sccm, 180 W, 6 mTorr pressure). A representative SEM image of the pattern is shown in FIG. 5, which shows a fingerprint pattern formed by the oxidized PDMS and no degradation of the pattern. This demonstrates the composition of block copolymer and brush can be used to eliminate the two step process of coating and annealing the brush and block copolymer in separate steps, thereby greatly reducing overall processing cost.

Example 2

Figure 6:
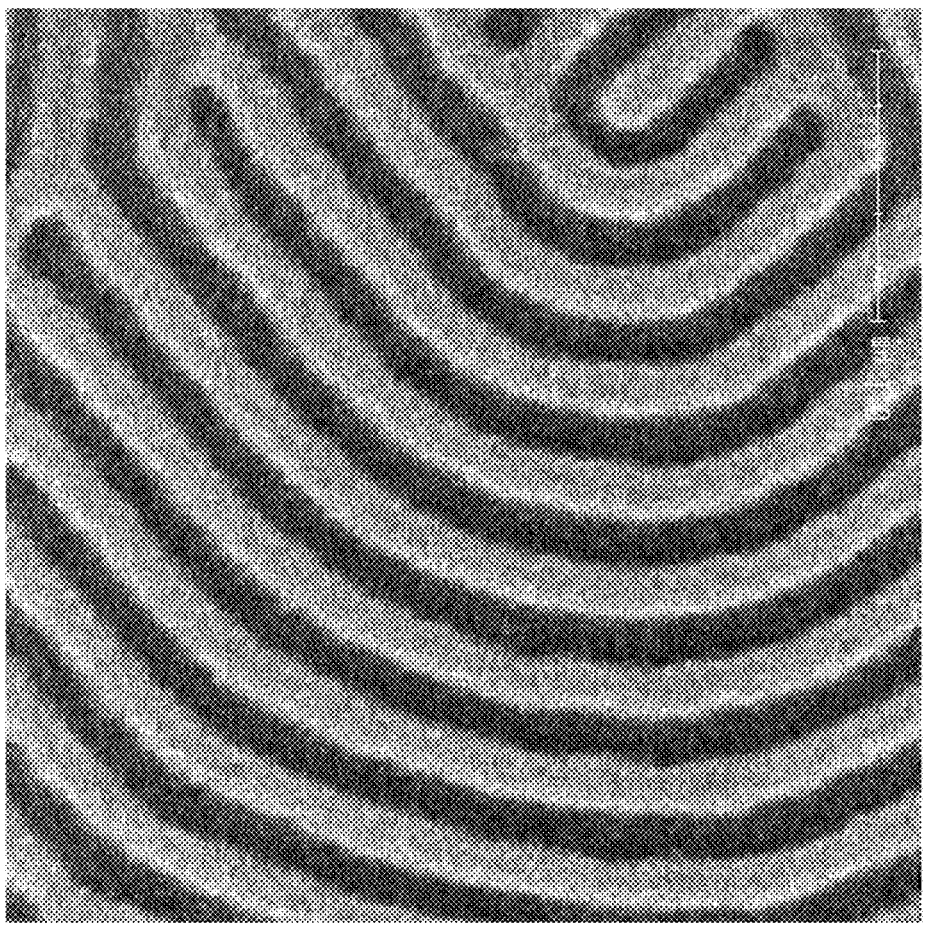
FIG. 6 too depicts a scanning electron microscope image of a fingerprint pattern formed by the oxidized PDMS after applying the inventive process and composition of PS-OH brush mixed with the PS-b-PDMS block copolymer, with no degradation of the pattern relative to the two-step process.

A formulation forming a cylindrical morphology of PS-b-PDMS of 34 nm domain spacing (PS-b-PDMS-34) was prepared by blending PGMEA solutions of PS-b-PDMS-1 with PS-b-PDMS-2 in a 85:15 weight ratio at 1.22 wt % solution. PS-OH-2 (0.050 g), was added to 10 g of this solution to form a solution containing both the PS-b-PDMS-34 and PS-OH-2 brush. A silicon wafer with native oxide coating was coated with a thin film of the composition by spin coating at 1,000 rpm, soft baking at 130° C. for 1 minute to remove residual solvent, and annealing at 340° C. for 2 minutes under nitrogen. Reactive ion etch was then performed using a Plasma Therm 790+ using a two-stage etch, first using a $CHF_3$ (50 sccm, 100 W, 10 mTorr pressure) to remove the top layer of PDMS followed by an oxygen etch to remove the PS and oxidize the PDMS (25 sccm, 180 W, 6 mTorr pressure). A representative SEM image of the pattern is shown in FIG. 6, which shows a fingerprint pattern formed by the oxidized PDMS and no degradation of the pattern. This demonstrates the composition of block copolymer and brush can be used to eliminate the two step process of coating and annealing the brush and block copolymer in separate steps, thereby greatly reducing overall processing cost.

What is claimed is:

1. A composition comprising:
   an intimate mixture of complete volumes of a blend of block copolymers; where each block copolymer comprises a first polymer and a second polymer; where the first polymer and the second polymer of each of the block copolymers are different from each other and each of the block copolymers forms a phase separated structure; where the block copolymer is poly(styrene-b-vinyl pyridine), poly(styrene-b-butadiene), poly(styrene-b-alkenyl aromatics), poly(isoprene-b-ethylene oxide), poly(styrene-b-(ethylene-propylene)), poly(ethylene oxide-b-caprolactone), poly(butadiene-b-ethylene oxide), poly(styrene-b-t-butyl (meth)acrylate), poly(methyl methacrylate-b-t-butyl methacrylate), poly(ethylene oxide-b-propylene oxide), poly(styrene-b-tetrahydrofuran), poly(styrene-b-isoprene-b-ethylene oxide), poly(styrene-b-trimethylsilylmethyl methacrylate), poly(methyl methacrylate-b-dimethylsiloxane), poly(methyl methacrylate-b-trimethylsilylmethyl methacrylate),
   an additive polymer; where the additive polymer comprises a reactive moiety that is operative to react with a substrate upon which it is disposed; and where the additive polymer comprises a homopolymer that is the chemically and structurally same as one of the polymers in each of the block copolymers or where the additive polymer comprises a random copolymer that has a preferential interaction with one of the blocks of each of the block copolymers; and
   a solvent.

2. The composition of claim 1, where the additive polymer is a polystyrene, a polysiloxane, a polymethylmethacrylate, a polyacrylate, a polyvinylacetate, a polydiene, a polyether a polyester, a polyorganogermane, or a combination comprising at least one of the foregoing polymers.

3. The composition of claim 1, where the additive polymer is a hydroxyl terminated polystyrene, hydroxyl terminated polydimethylsiloxane, hydroxyl terminated poly(methylmethacrylate-random-trifluoroethylmethacrylate), a hydroxyl terminated poly(methylmethacrylate-random-dodecafluoroheptylmethacrylate), or a combination comprising at least one of the foregoing polymers.

4. The composition of claim 1, where the composition when annealed to temperatures of 200 to 450° C. forms horizontal cylinders or spheres.

* * * * *